United States Patent
Lee et al.

(10) Patent No.: US 6,384,446 B2
(45) Date of Patent: *May 7, 2002

(54) GROOVED CAPACITOR STRUCTURE FOR INTEGRATED CIRCUITS

(75) Inventors: Kuo-Hua Lee; Simon John Molloy; Daniel Joseph Vitkavage, all of Orlando, FL (US)

(73) Assignee: Agere Systems Guardian Corp., Orlando, FL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/024,601

(22) Filed: Feb. 17, 1998

(51) Int. Cl.[7] .................... H01L 29/76; H01L 29/94; H01L 31/113; H01L 31/119

(52) U.S. Cl. ............... 257/309; 257/308; 257/301; 257/303; 257/306

(58) Field of Search ................ 257/306, 301, 257/303, 309, 317, 308, 377, 382, 383

(56) References Cited

U.S. PATENT DOCUMENTS

| | | | | |
|---|---|---|---|---|
| 5,012,310 A | * | 4/1991 | Kimura et al. ............ 357/23.6 |
| 5,017,981 A | * | 5/1991 | Sunami et al. ............ 357/23.6 |
| 5,274,258 A | * | 12/1993 | Ahn ............................ 257/309 |
| 5,300,801 A | * | 4/1994 | Blalock et al. ............ 257/309 |
| 5,414,655 A | * | 5/1995 | Ozaki et al. ................ 257/306 |
| 5,418,388 A | * | 5/1995 | Okudaira et al. ........... 257/295 |
| 5,612,574 A | * | 3/1997 | Summerfelt et al. ........ 257/783 |
| 5,629,539 A | * | 5/1997 | Aoki et al. ................. 257/306 |
| 5,753,948 A | * | 5/1998 | Nguyen et al. ............. 257/307 |
| 5,773,314 A | * | 6/1998 | Jiang et al. .................... 438/3 |
| 5,796,573 A | * | 8/1998 | Kotecki et al. ............. 257/306 |
| 5,891,772 A | * | 4/1999 | Hsu ............................ 257/309 |
| 5,998,825 A | * | 12/1999 | Ochiai ........................ 257/311 |

FOREIGN PATENT DOCUMENTS

JP 404026156 A * 1/1992 ................. 257/309

* cited by examiner

*Primary Examiner*—Eddie Lee
*Assistant Examiner*—Jesse A Fenty

(57) ABSTRACT

An improved method of capacitor formation is disclosed. A dielectric is etched with an etch recipe which creates grooves within an opening. The opening is filled with metal which conforms to the grooves, thereby creating a capacitor's lower plate with increased surface area. The metal is later surrounded with dielectric and metal, which forms respectively the capacitor's dielectric and upper plate.

9 Claims, 3 Drawing Sheets

GROOVED CAPACITOR STRUCTURE FOR INTEGRATED CIRCUITS

TECHNICAL FIELD OF THE INVENTION

This invention relates to methods of integrated circuit fabrication and the devices produced thereby.

BACKGROUND OF THE INVENTION

It is becoming increasingly popular in the manufacture of modern integrated circuits to include intergral capacitors within the integrated circuit. For example, many DRAM designs and many analog designs include intergral capacitors within an integrated circuit chip. Often the capacitors are made by trenching into the silicon substrate.

Those concerned with the development of integrated circuits have consistently sought new capacitor designs and methods for forming these designs. Of particular interest are fabrication methods which produce capacitors with increased capacitance within small volumes.

SUMMARY OF THE INVENTION

An improved method of integrated circuit fabrication and an improved integrated circuit address the above concerns.

A first illustrative embodiment includes a method of integrated circuit fabrication which includes forming a conductive plug having an outer surface with grooves;

forming a dielectric which fills the grooves; and forming a conductive material over the dielectric; the conductive plug, the dielectric, and the conductive material together comprising a capacitor.

A second illustrative embodiment includes a method of integrated circuit fabrication which includes forming a patterned photoresist upon a first material layer; and etching the first material layer by a process which forms grooves in the photoresist.

A third illustrative embodiment includes a method of integrated circuit fabrication which includes forming a transistor upon a substrate;

forming a first dielectric overlying the substrate and the transistor;

forming an opening within the first dielectric; the opening being defined by a wall with grooves;

forming at least one first conductive material within the opening, the first conductive material having a respective wall with grooves;

forming a second dielectric covering a portion of the wall of the first conductive material; and forming a second conductor covering the second dielectric.

A fourth illustrative embodiment includes an integrated circuit which includes:

a first conductor having a wall with grooves;

a dielectric contacting the conductor;

a second dielectric contacting the dielectric;

the first and second conductors and the dielectric together comprising a capacitor.

A fifth illustative embodiment includes an integrated circuit which includes:

a transistor;

a first dielectric covering the transistor;

a conductive plug partially embedded in said dielectric; the conductive plug having a top and a wall, the wall having grooves;

a second dielectric covering the plug top and a portion of the grooved wall; and a patterned conductive layer covering the second dielectric.

DETAILED DESCRIPTION OF THE INVENTION

Figure 1:
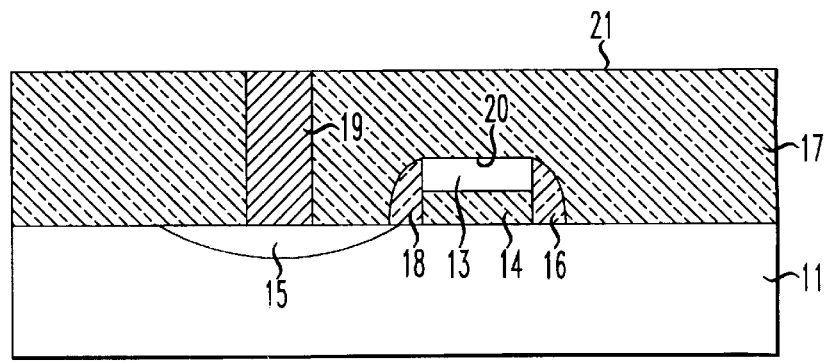
FIGS. 1 and 2 are cross-sectional views of an illustrative embodiment of the present invention.

Turning to FIG. 1, reference numeral 11 denotes a substrate which may be silicon, epitaxial silicon, doped silicon, etc. Reference numeral 13 denotes, illustratively a gate which may include spacers 16 and 18, dielectric 14, and conductor 20. Reference numeral 15 denotes a source/drain. Reference numeral 17 denotes a dielectric which may, illustratively be an oxide of silicon, perhaps formed from a chemical precursor such as TEOS. Desirably, the upper surface 21 of dielectric 17 is planarized or considerably smoothed, illustratively by chemical mechanical polishing (CMP), or other means. Reference numeral 19 denotes a conductive material, illustratively a plug contacting source/drain 15. Illustratively, conductor 19 may be a tungsten plug (or a copper plug). Plug 19 may, if desired, be surrounded by layers of titanium or titanium nitride. By way of illustration, dielectric 17 may be approximately 8000 Å thick over source/drain 15, and 6000 Å thick over gate 13. The dimensions of plug may be, for example, 0.24 microns by 0.24 microns. Should the titanium and titanium nitride be utilized with plug 19, illustrative thicknesses are roughly 200 Å of titanium, 600 Å of titanium nitride.

Figure 2:
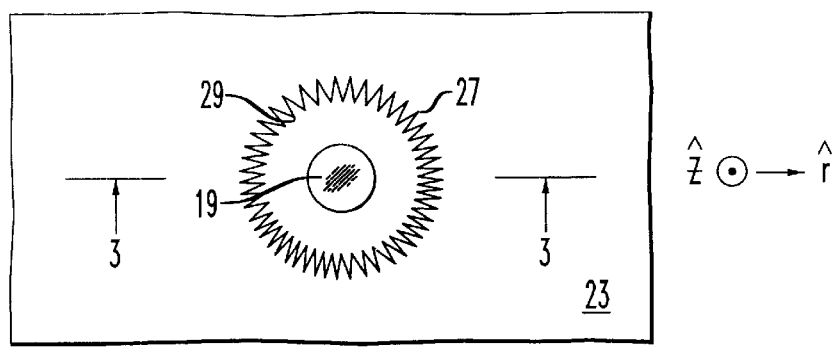

Turning to FIG. 2, metal runner 25 is formed on top surface 21 of dielectric 17. By way of illustration, metal runner 25 might be formed from 300 Å of titanium, 600 Å of titanium nitride, with 4500 Å of aluminum, capped with 250 Å of titanium nitride. Dielectric 23 is next deposited over runner 25. Illustratively, dielectric 23 may be an oxide of silicon, perhaps formed by the decomposition of the chemical precursor such as TEOS. Illustratively, the thickness of dielectric 23 may be 0.8 microns.

Next, window 27 is opened in dielectric 23. Illustratively, window 27 also partially penetrates dielectric 17 due to over etching of the window. (The over-etched window facilitates contact with later-formed layers 33, 35 and 37 in FIG. 4.) By way of illustration, the dimensions of window 27 may be 0.24 microns by 0.74 microns.

Applicants have discovered an etching process which creates a multiplicity of vertical (oriented along the $\hat{z}$ axis, shown in FIG. 2) grooves 29 in the sidewall of window 27. (Subsequent processing steps, to be described in later detail below, will show how window 27 is filled with a conductive material which later forms the bottom plate of a capacitor. Thus, the creation of grooves 29 makes it possible to form a capacitor's bottom plate having increased surface area. Consequently, it is possible to form a capacitor with desirably increased capacitance within a small volume.)

As mentioned before, dielectric 23 is a single layer of an oxide of silicon, illustratively formed by the decomposition of a plasma precursor such as TEOS. Illustratively, window 27 is etched in a chemical reactor such as lam 9500, manufactured by Lam Research Corp., Fremont, Calif. A Shipley photoresist, for example that designated SPR 950, manufactured by Shipley Company, Marlborough, Mass. illustratively may be used. A typical exposure time is 500 milliseconds. The thickness of the photoresist may be approximately 7600 Å. A 600 watt bias power maybe applied to the lower electrode and zero watt source power may be used. Etching gases may be $CHF_3$ (170 cc/min.), $C_2F_6$ (30 cc/min.) and Ar (120 cc/min.). Typical chamber pressure may be 30 milliTorr, with a range of 20–40 milli-Torr being acceptable. Typical window depth may be approximately 1 micron. The tolerance for each of the above parameters is ±10%. Applicants have found that the above-described etching process tends to form grooves in the photoresist. These grooves are then transferred to the inside of the dielectric window 27, thus forming grooves 29. It is noticed that preferred processing tends toward thinner photoresist. Thinner photoresist has been observed to be more amenable to groove formation. Photoresist thicknesses above 10,000 Å tend to produce very little or no grooving. More conventional oxide etch chemistries using $C_4F_8$ and $C_2F_6$ tend to produce smooth walls or at best, insignificant grooves.

In addition, opening 31 is also formed over runner 25. (Opening or window 31 also has the above-mentioned grooves since it is formed during the same etching process.)

Figure 3:
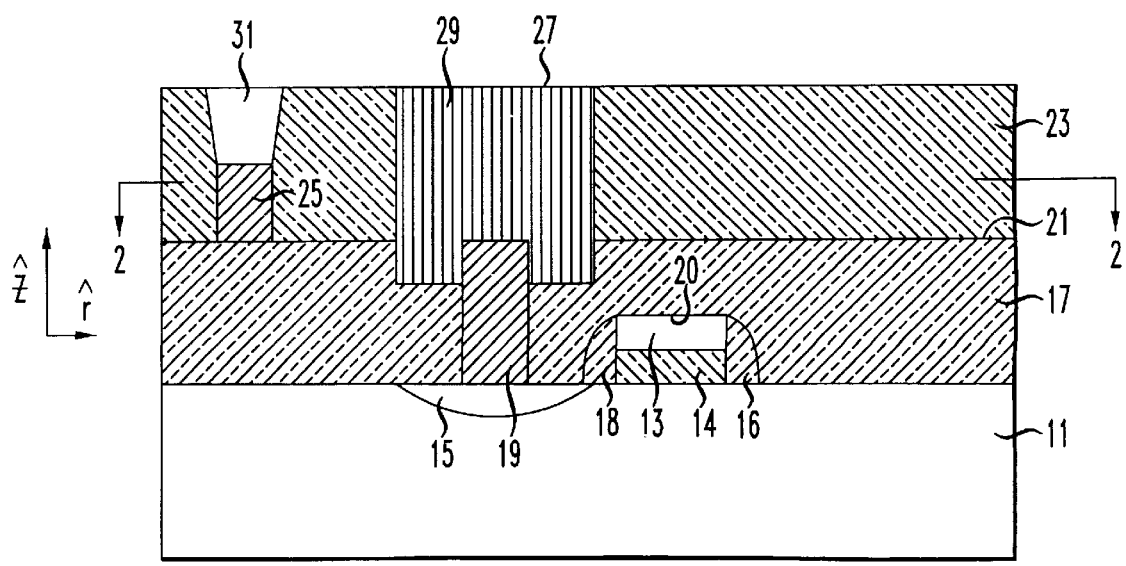
FIG. 3 is plan view of a portion of the integrated circuit shown in FIG. 2.

FIG. 3 shows a top down view of opening 27 with grooves 29. The upper surface of plug 19 protruding into opening 27 is illustrated. Typically, the grooves are characterized by sharp exterior points and depths of 200–500 Å.

Figure 4:
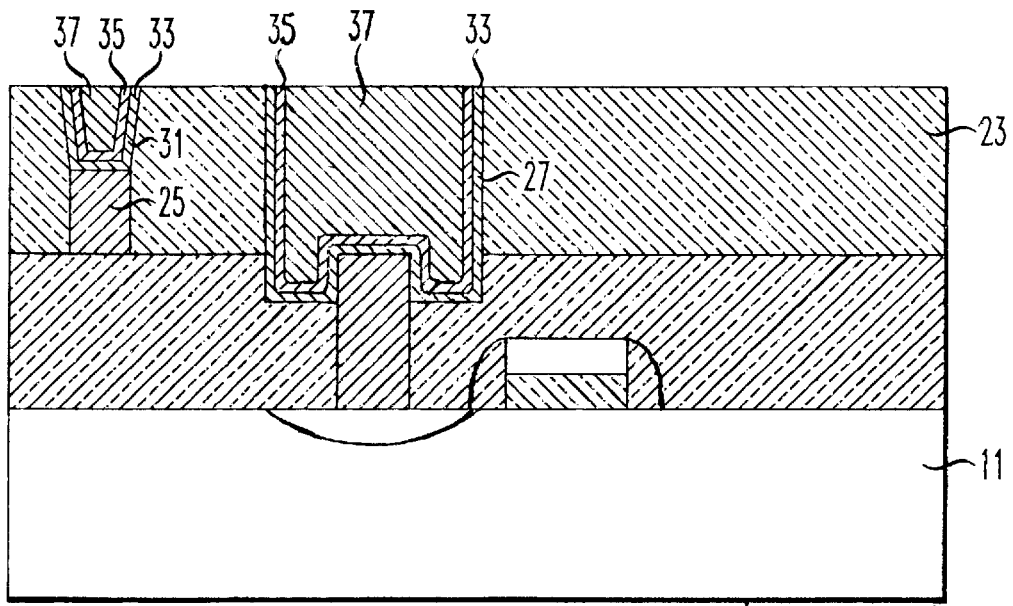
FIGS. 4, 5 and 6 are also partial cross-sectional views of an illustrative embodiment of the present invention.

Turning to FIG. 4, openings 27 and 31 are first filled with, illustratively 200 Å titanium (reference numeral 33); 600 Å titanium nitride (reference numeral 35); and a 4000 Å tungsten plug (reference numeral 37). Other conductors may be used for plug 37 and layers 35 and 33 eliminated. CMP may be utilized to smooth the upper surfaces of tungsten plug 37 (and layers 35 and 33), thereby making it flush with the upper surface of dielectric 23. Titanium layer 33 fills grooves 29 and opening 27, thereby later creating a capacitor's bottom plate with greater surface area than would be obtained if opening 27 had conventional, comparatively smooth sides.

Figure 5:
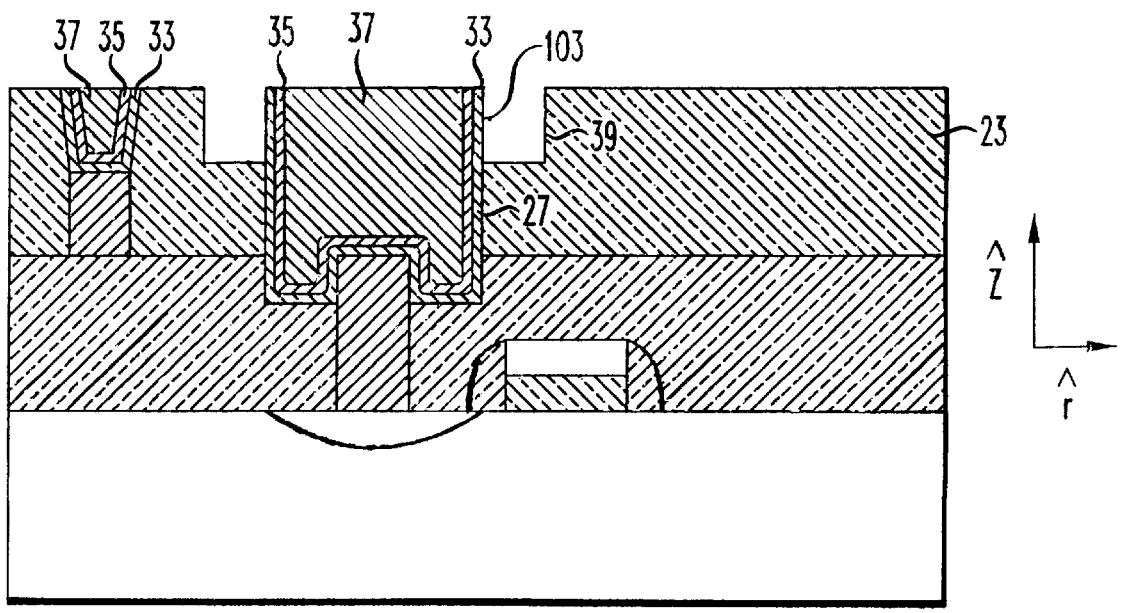
Figure 6:
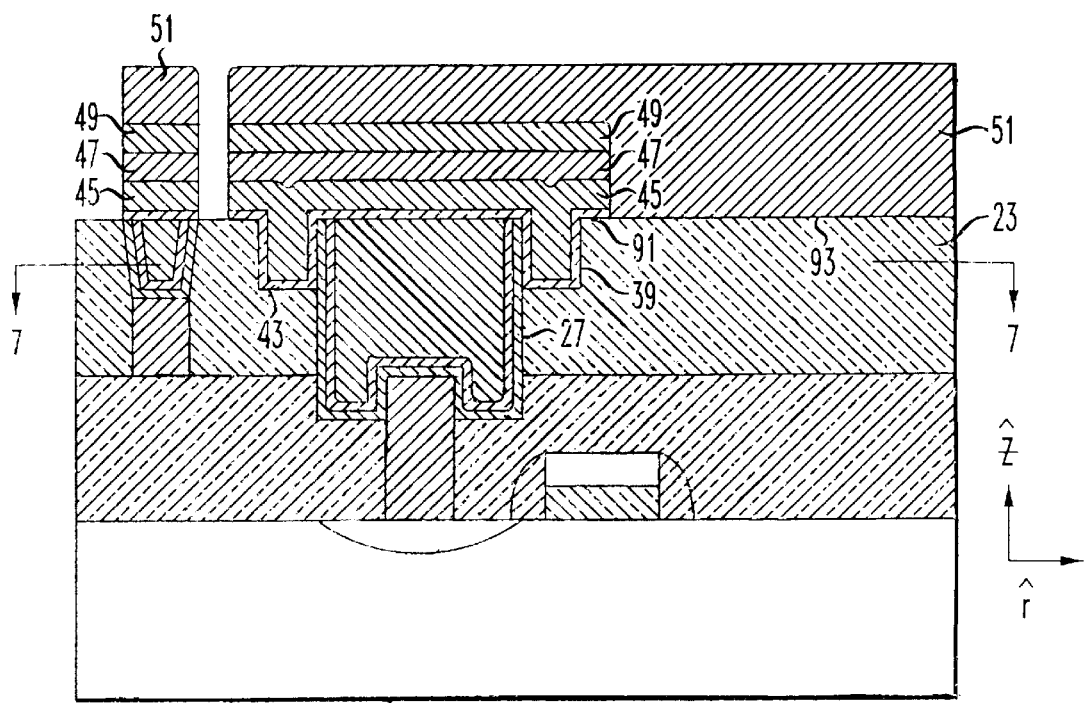
Figure 7:
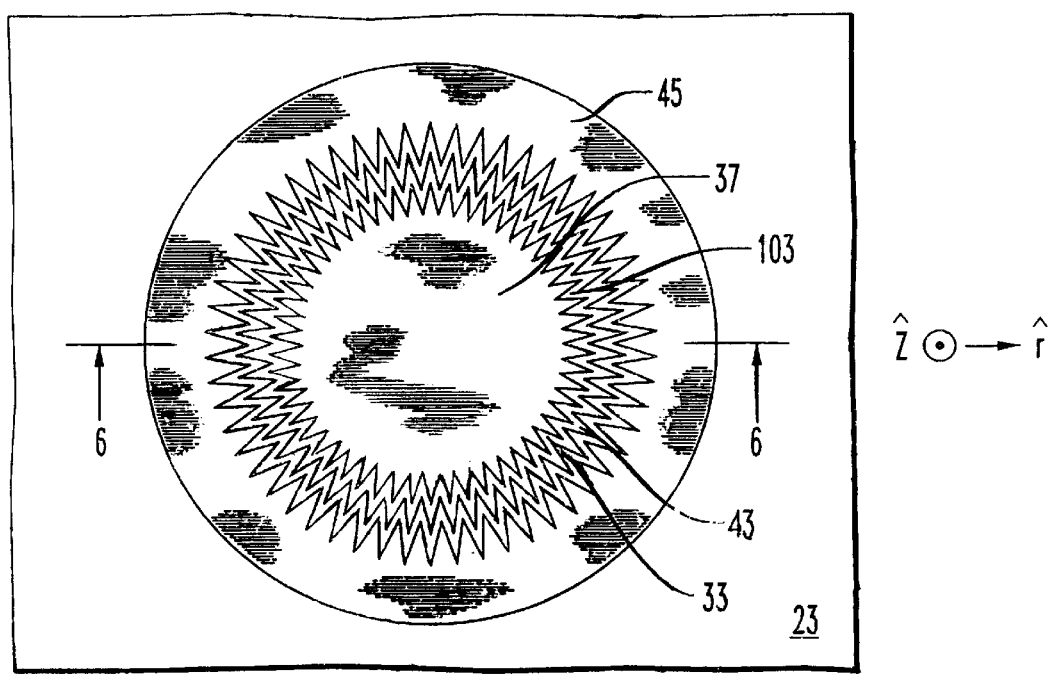
FIG. 7. is a partial cross-sectional view along line 6—6.

Turning to FIG. 5, opening 39 is created by anisotropically etching a trench around tungsten plug 37 together with titanium nitride 35 and titanium 33. Outer surface 103 of titanium layer 33 exhibits vertical (oriented along the ẑ axis, shown in FIG. 6) grooves defined by its deposition within grooved dielectric 23. Thus, grooved dielectric functions as a mold for the outer surface of titanium layer 33. Of course, the grooves in surface 103 are complementary to grooves 29 in dielectric 23. Opening 39 is filled, illustratively with a dielectric having a high dielectric constant, for example 100 Å of $Ta_2O_5$ (in FIG. 6). It will be noted that $Ta_2O_5$ layer 43 coats the inside of opening 39 (generally conformal to the grooves in layer 33), covers the top surfaces of tungsten 37, titanium nitride 35, and titanium 33, and also covers a small portion 91 of the upper surface 93 of dielectric 23. Thus, dielectric 43 also exhibits grooves due to its conformal deposition.

A variety of single or multi-layer conductors may be deposited over dielectric 43 to form the upper plate of the capacitor. For example, reference numeral 45 may denote, illustratively 1000 Å of titanium nitride (which becomes generally conformal to dielectric 43); reference numeral 47 may denote 300 Å of titanium; reference numeral 49 may denote 600 Å of titanium nitride; and reference numeral 51 may denote 4500 Å of aluminum. Then conductors may also form runner 101.

Capacitors formed by applicants' process have been formed to exhibit 30–40% more capacitance per volume than capacitors formed without grooves.

It will be noted in FIG. 3 that opening 27 is depicted with a round cross section, although many lithographic reticles have square shaped reticles. However, as those skilled in the art know, the shape of the window produced in an oxide 23 is generally somewhat rounded as shown in FIG. 3. (Of course, as mentioned before, the overall shape of applicant's window is modulated by grooves 29.)

The thicknesses of layers of titanium, titanium nitride, tungsten, silicon dioxide, etc. above are ideal and may be expected to vary approximately ±10%.

Further processing, including the deposition and planarization of additional dielectrics, etc., may take place at this point.

The inventive concept may be also adapted by those skilled in the art to damascene processes which may illustratively use copper. For example, the tungsten plug 37 (with or without additional layers such as 35, 33) may be replaced by copper.

Other conductors may also be damascene copper (e.g. 45 or 47 or 49).

What is claimed:

1. An integrated circuit capacitor comprising:
   an oxide material having no more than one layer; and
   a capacitor disposed in said oxide material, said capacitor having a first conductor with grooves, a second conductor with grooves and a dielectric layer between said first and said second conductors, said dielectric being substantially conformal with said grooves of said first and said second conductors; and
   wherein the first conductor forms a conductive plug having a bottom surface, said conductive plug bottom surface having recess formed therein.

2. An integrated circuit capacitor as recited in claim 1, wherein said grooves of said first conductor and said second conductor are vertical.

3. An integrated circuit capacitor as recited in claim 1, wherein the conductive plug has an outer surface with at least one layer of conductive material disposed thereon.

4. An integrated circuit capacitor as recited in claim 1, wherein the conductive plug is W and the conductive plug has successive layers of Ti and TiN disposed thereon.

5. An integrated circuit capacitor as recited in claim 1, wherein said dielectric material is $Ta_2O_5$.

6. An integrated circuit capacitor as recited in claim 1, wherein said second conductor is multi-layer of Ti/TiN.

7. The integrated capacitor of claim 1 wherein the oxide material has recess and the conductive plug is formed in and fills the recess.

8. The integrated circuit capacitor of claim 1 further comprising a second conductive plug is formed in the recess.

9. The integrated circuit capacitor of claim 1 wherein the conductive plug has an upper surface that is coplanar with an upper surface of the oxide material.

* * * * *